US011764765B2

(12) United States Patent
Gupta et al.

(10) Patent No.: US 11,764,765 B2
(45) Date of Patent: Sep. 19, 2023

(54) AGING-RESISTANT SCHMITT RECEIVER CIRCUIT

(71) Applicant: Synopsys, Inc., Mountain View, CA (US)

(72) Inventors: Rahul Gupta, Faridabad (IN); Nitin Bansal, Greater Noida (IN); Akhil Thotli, Madanapalle (IN); Manoj Kumar Reddy Puli, Guntur (IN)

(73) Assignee: Synopsys, Inc., Sunnyvale, CA (US)

( * ) Notice: Subject to any disclaimer, the term of this patent is extended or adjusted under 35 U.S.C. 154(b) by 0 days.

(21) Appl. No.: 17/502,548

(22) Filed: Oct. 15, 2021

(65) Prior Publication Data

US 2022/0123738 A1    Apr. 21, 2022

Related U.S. Application Data

(60) Provisional application No. 63/092,941, filed on Oct. 16, 2020.

(51) Int. Cl.
| | |
|---|---|
| *H03K 3/00* | (2006.01) |
| *H03K 3/037* | (2006.01) |
| *H03K 3/3565* | (2006.01) |

(52) U.S. Cl.
CPC ......... *H03K 3/0377* (2013.01); *H03K 3/3565* (2013.01)

(58) Field of Classification Search
CPC .. H03K 3/0377; H03K 3/3565; H03K 3/2897; H03K 3/02337
See application file for complete search history.

(56) References Cited

U.S. PATENT DOCUMENTS

| | | | | |
|---|---|---|---|---|
| 5,604,449 A | * | 2/1997 | Erhart | H03K 19/00315 326/121 |
| 6,304,120 B1 | * | 10/2001 | Taito | H03K 19/0013 327/170 |
| 6,392,440 B2 | * | 5/2002 | Nebel | H03K 19/00315 326/83 |
| 7,659,748 B2 | * | 2/2010 | Chandra | H03K 19/00384 326/88 |
| 9,735,763 B1 | * | 8/2017 | Chen | H03K 19/0175 |
| 2005/0122152 A1 | * | 6/2005 | Yoshida | H03K 3/3565 327/285 |
| 2007/0063738 A1 | * | 3/2007 | Fischer | H03K 19/0013 326/83 |
| 2015/0130511 A1 | * | 5/2015 | P | H03K 19/017509 326/88 |
| 2016/0105183 A1 | * | 4/2016 | Kim | H03K 19/00315 327/333 |
| 2016/0182022 A1 | * | 6/2016 | Kumar | H03K 3/3565 327/206 |
| 2019/0312575 A1 | * | 10/2019 | Tiwari | H03K 17/0822 |
| 2020/0136595 A1 | * | 4/2020 | Garg | H03K 3/3565 |
| 2021/0013873 A1 | * | 1/2021 | Chen | H03K 19/018521 |

* cited by examiner

*Primary Examiner* — Tuan T Lam
(74) *Attorney, Agent, or Firm* — Park, Vaughan, Fleming & Dowler LLP; Laxman Sahasrabuddhe (57) ABSTRACT

A receiver circuit may include a first stage and a second stage. The first stage may include a first inverter circuit to generate a first signal based on an input signal and a second inverter circuit to generate a second signal based on the input signal. The second stage may determine a logic state of the input signal by combining the first signal generated by the first inverter circuit and the second signal generated by the second inverter circuit.

8 Claims, 8 Drawing Sheets

AGING-RESISTANT SCHMITT RECEIVER CIRCUIT

RELATED APPLICATION

This application claims the benefit of U.S. Provisional Application Ser. No. 63/092,941, filed on 16 Oct. 2020, the contents of which are herein incorporated by reference in their entirety for all purposes.

TECHNICAL FIELD

The present disclosure relates to an integrated circuit (IC). More specifically, the present disclosure relates to an aging-resistant Schmitt receiver circuit.

BACKGROUND

An increasing demand for computing and storage capacity has fueled an increase in the size and complexity of IC designs. A Schmitt receiver circuit may be used to determine the logic state of a digital signal. Aging refers to the degradation of one or more parameters of a circuit element over time.

SUMMARY

Embodiments described herein may feature a circuit that includes a first stage and a second stage. The first stage may include a first inverter circuit to generate a first signal based on an input signal and a second inverter circuit to generate a second signal based on the input signal. The second stage may determine a logic state of the input signal by combining the first signal generated by the first inverter circuit and the second signal generated by the second inverter circuit. The first stage may be powered by a first power-supply-voltage range and the second stage may be powered by a second power-supply-voltage range that is greater than the first power-supply-voltage range.

Some embodiments described herein may include a first clamp circuit and a second clamp circuit, where each clamp circuit may restrict a voltage range of the input signal, and where an output of each clamp circuit may be provided as an input to a corresponding inverter circuit. Some embodiments described herein may include a latch circuit to store a logic state of the input signal.

In some embodiments described herein, the first stage may independently control a high-trip voltage (VIH) and a low-trip voltage (VIL) that are used to determine the logic state of the input signal.

In some embodiments described herein, the second stage may include a comparator circuit. In some embodiments described herein, the comparator circuit may include a set of p-type metal-oxide-semiconductor (PMOS) transistors and a set of n-type metal-oxide-semiconductor (NMOS) transistors coupled in series. In some embodiments described herein, the first signal generated by the first inverter circuit may be provided to a gate of a PMOS transistor in the set of PMOS transistors and the second signal generated by the second inverter circuit may be provided to a gate of an NMOS transistor in the set of NMOS transistors.

BRIEF DESCRIPTION OF THE FIGURES

The disclosure can be understood based on the detailed description given below and the accompanying figures. The figures are for illustrative purposes, and do not limit the scope of the disclosure. Furthermore, the figures are not necessarily drawn to scale.

DETAILED DESCRIPTION

Embodiments described herein feature an aging-resistant Schmitt receiver circuit. As device dimensions shrink to few nanometers, the voltage that a device can sustain is also decreasing because of the reduction in the gate oxide thickness. Shrinking device dimensions reduces power consumption and area, which in turn reduces the cost. However, some circuits may still need to be operated at higher voltages, e.g., at 3.3 volts (V) or 5V. For example, higher supply voltage ranges may be used in circuits (e.g., circuits in peripheral components) that enable IC designs operating at different supply voltages to communicate with one other. A receiver circuit may refer to a circuit that converts an external digital signal into an internal digital signal. Receiver circuits may degrade over time, which may increase the number of errors that the receiver circuit makes while converting the external digital signal into an internal digital signal.

Embodiments described herein feature an aging-resistant receiver circuit, i.e., a receiver circuit that does not degrade over time. Some embodiments provide an aging-resistant Schmitt receiver circuit which can operate at high voltages (e.g., 3.3V) while using low voltage (e.g., 1.8V) devices. Embodiments described herein provide a highly reliable Schmitt receiver circuit in which the high-trip voltage (VIH) and low-trip voltage (VIL) does not degrade over time even in conditions where the input to the Schmitt receiver circuit is maintained at intermediate signal levels. A voltage above VIH is interpreted as a logic 1, and a voltage below VIL is interpreted as a logic 0. Voltages between VIH and VIL are rejected or ignored, i.e., voltages in this range do not cause a change in the logic state. Additionally, embodiments disclosed herein improve the VIH-VIL spread (i.e., the voltage gap between the VIH voltage and the VIL voltage) by adding a separate stage which can provide independent control of VIH/VIL trip voltages, i.e., embodiments described herein enable the VIH and VIL voltages to be controlled separately. Embodiments described herein may be used in various Joint Electron Device Engineering Council (JEDEC) standard based input/output (I/O) applications.

Figure 1:
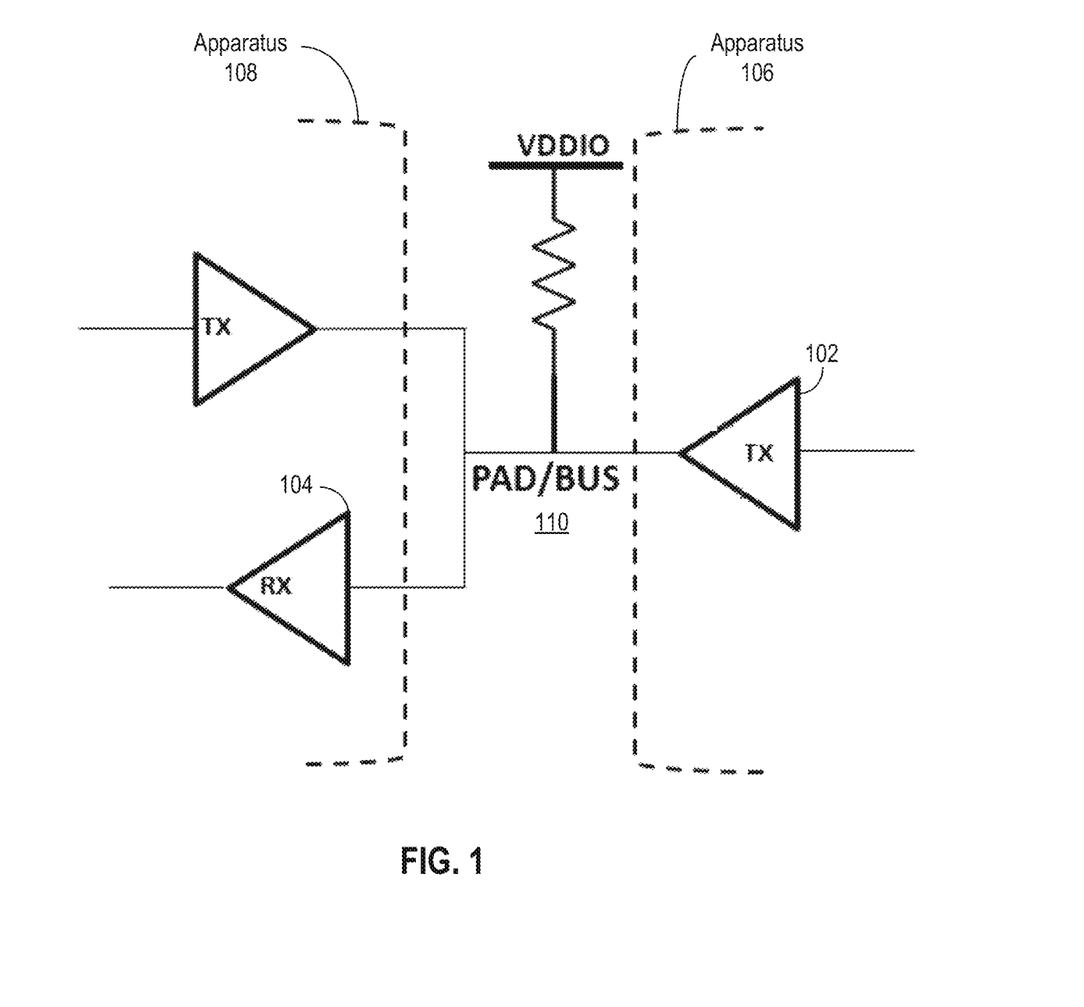
FIG. 1 illustrates a transmitter circuit coupled to a receiver circuit.

FIG. 1 illustrates a transmitter circuit coupled to a receiver circuit. Apparatus 106 may transmit a signal to apparatus 108 over PAD/BUS 110. Specifically, transmitter circuit 102 may drive the voltage of PAD/BUS 110 and receiver circuit 104 may receive the voltage. The voltage of PAD/BUS 110 may be pulled up or pull down weakly (i.e., the voltage may have a low slew) by transmitter circuit 102 to define the logic state of PAD/BUS 110. For example, transmitter circuit 102 may use a low drive current, which may cause the voltage of PAD/BUS 110 to slowly change between the two logic states. In such situations, it is possible that the input of receiver circuit 104 may remain at an intermediate voltage level, i.e., around VIH or VIL. Moreover, the intermediate voltage level may be maintained for most of the time during normal operation. When the input of receiver 104 is maintained at a static VIH/VIL level, it leads to a steady state current (hereinafter referred to as the "crowbar current") to flow in receiver 104.

This steady state current may cause two issues: (1) a violation of the electromagnetic (EM) limits of the metal rails used in receiver 104, and (2) if receiver 104 is operating at a voltage higher than the device's safe operating voltage range, then it may cause the device to degrade. The first issue may be addressed by defining desired EM limits during layout design. However, the second issue may lead to higher gate-to-source voltage (VGS) or drain-to-source voltage (VDS), which may cause the devices to degrade over time.

In receiver designs, a first stage may define the noise margins (VIH/VIL) of the receiver. If transistors in this stage start to degrade, then the VIH/VIL voltage values may also start to degrade. Over time, this may cause the receiver's noise margin to violate desired specifications.

Figure 2:
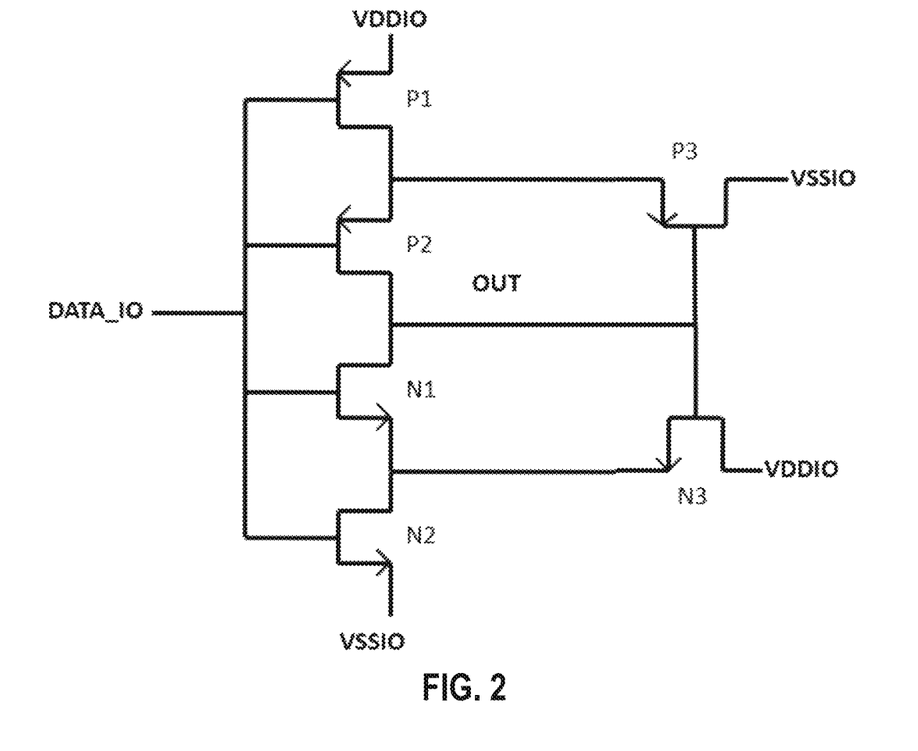
FIG. 2 illustrates a Schmitt trigger.

FIG. 2 illustrates a Schmitt trigger. Schmitt triggers may be used in a receiver to reject the noise at the input, thereby preventing bit errors. When DATA_IO rises from 0 to a supply voltage (VDDIO), n-type metal-oxide-semiconductor (NMOS) transistor N2 sinks current through a ground voltage (VSSIO), which toggles output OUT. The toggling of output OUT causes the VIH (i.e., high-trip voltage) of the Schmitt trigger to be higher than VDDIO/2. Likewise, when DATA_IO falls from VDDIO to 0, p-type metal-oxide-semiconductor (PMOS) transistor P1 sources current from VDDIO to toggle output OUT. The toggling of output OUT causes the VIL (i.e., low-trip voltage) of the Schmitt trigger to be lower than VDDIO/2. The difference between VIH and VIL is referred to as hysteresis. Process variations may cause variations in the electrical characteristics of the NMOS and PMOS devices, which may cause variations in the VIH and VIL voltages and the hysteresis. Commonly used Schmitt triggers suffer from substantial degradation of VIH/VIL voltages over time.

Figure 3:
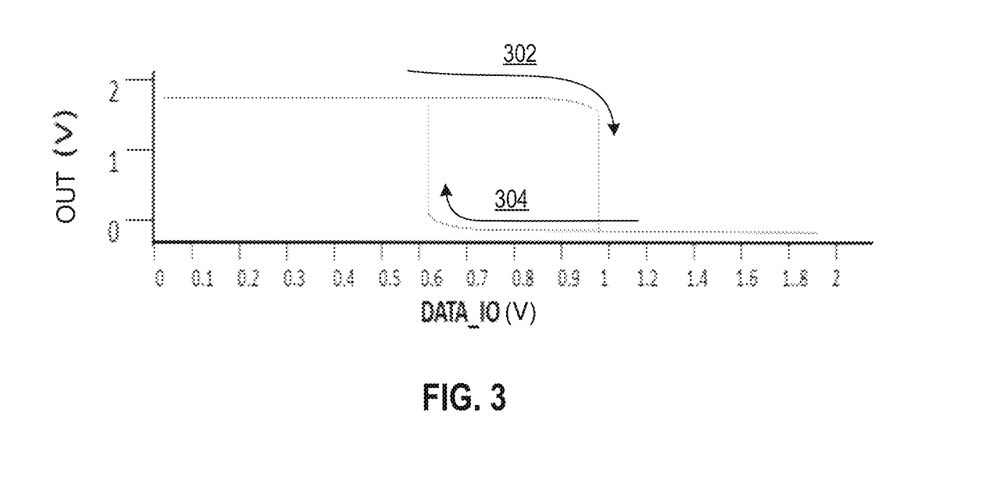
FIG. 3 illustrates transfer characteristics of a Schmitt trigger.

FIG. 3 illustrates transfer characteristics of a Schmitt trigger. The X-axis corresponds to the DATA_IO voltage in FIG. 2, and the Y-axis corresponds to the output OUT voltage in FIG. 2. When DATA_IO rises from 0 to VDDIO, the transfer characteristic curve 302 is followed, and when DATA_IO falls from VDDIO to 0, the transfer characteristic curve 304 is followed. In FIG. 3, the high switching threshold (i.e., VIH) is 0.98V and the low switching threshold (i.e., VIL) is 0.62V, and the difference between the high and low switching thresholds leads to hysteresis in the transfer characteristic.

Figure 4:
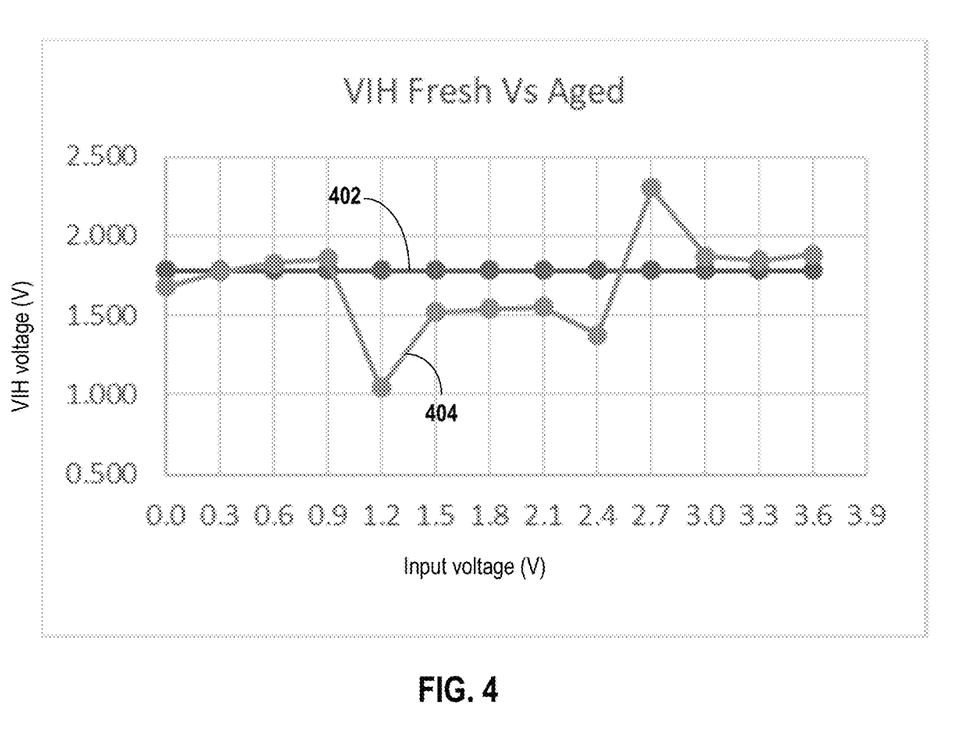
FIG. 4 illustrates VIH drift in a Schmitt trigger caused by aging.

FIG. 4 illustrates VIH drift in a Schmitt trigger caused by aging. The Schmitt trigger may operate at a high voltage (e.g., 3.3V), but may use low voltage (e.g., 1.8V) devices. The X-axis corresponds to the input pad voltage at the Schmitt trigger and the Y-axis corresponds to the VIH voltage. Curve 402 illustrates the VIH voltage for a fresh Schmitt trigger (i.e., without any aging), and curve 404 illustrates the VIH voltage for an aged Schmitt trigger. For example, an aged Schmitt trigger may refer to a Schmitt trigger in which the input pad has been stressed using different voltages for 10 years. As can be seen from FIG. 4, the VIH voltage of the Schmitt trigger drifts with respect to the input pad voltage after aging. A similar drift is also observed in the VIL voltage due to aging in Schmitt triggers.

Figure 5A:
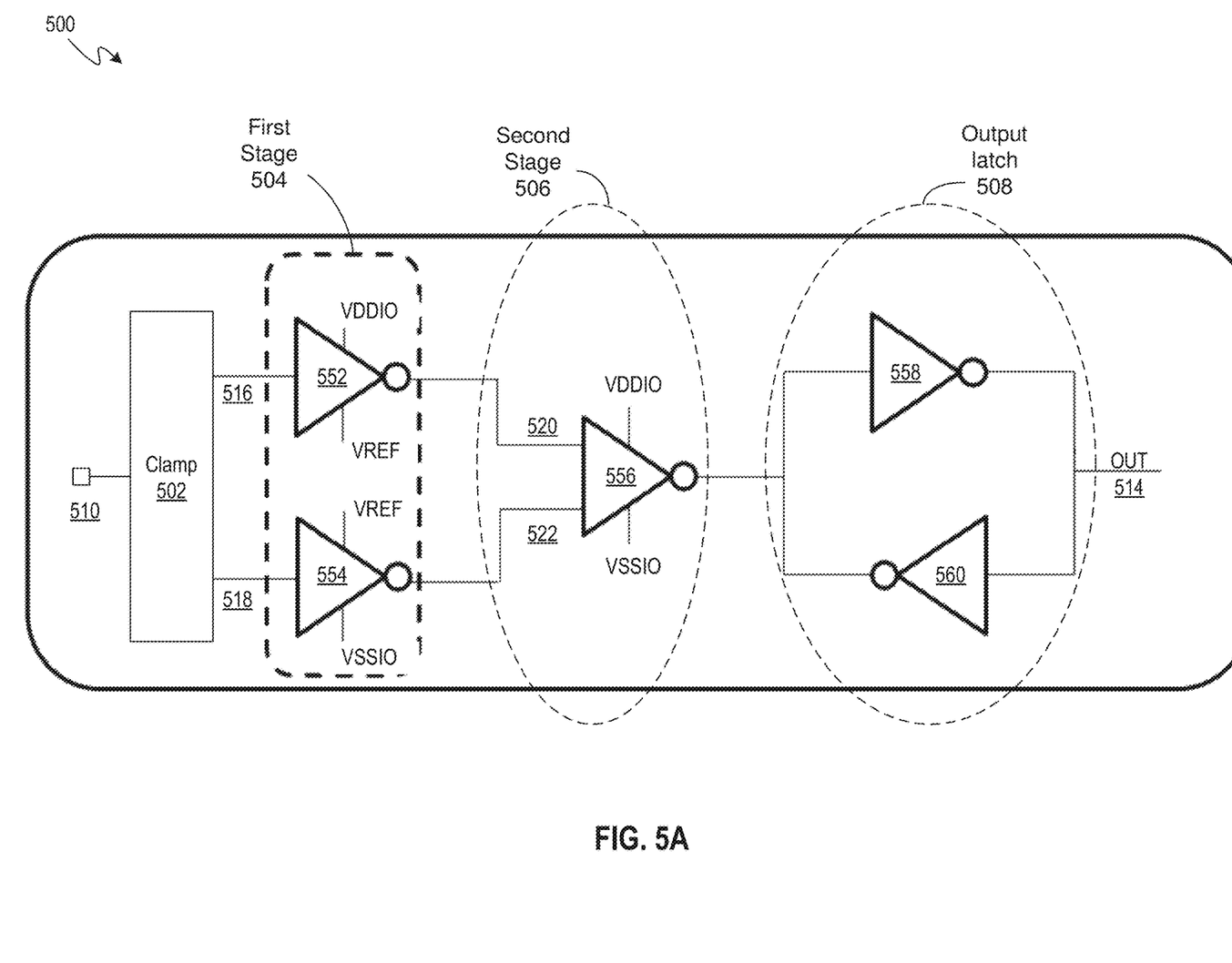
FIG. 5A illustrates a logic-level representation of a Schmitt receiver circuit in accordance with some embodiments disclosed herein.

FIG. 5A illustrates a logic-level representation of a Schmitt receiver circuit in accordance with some embodiments disclosed herein. Schmitt receiver circuit 500 includes clamp circuit 502, first stage circuit 504, second stage circuit 506, and output latch 508. First stage circuit 504 may be powered by low power-supply-voltage range and second stage circuit 506 may be powered by a high power-supply-voltage range.

Input pad 510 may receive an input signal and clamp circuit 502 may restrict the received input signal to a given voltage range. VREF may be an internal biasing voltage that protects the devices from stress. The voltage level of signal 518 signal is 0 to VREF and the voltage level of signal 516 is VREF to VDDIO. Signals 516 and 518 outputted by clamp circuit 502 may be provided as inputs to first stage 504, which may include inverters 552 and 554 which may be powered by a low power-supply-voltage range (e.g., 1.8V). The outputs 520 and 522 from first stage 504 may be merged by second stage 506, which may include digital latch 556. Digital latch 556 may be powered by a high power-supply-voltage range (e.g., 3.3V). The output from second stage circuit 506 may be provided to output latch 508, whose output 514 may be used as the output of Schmitt receiver circuit 500.

Figure 5B:
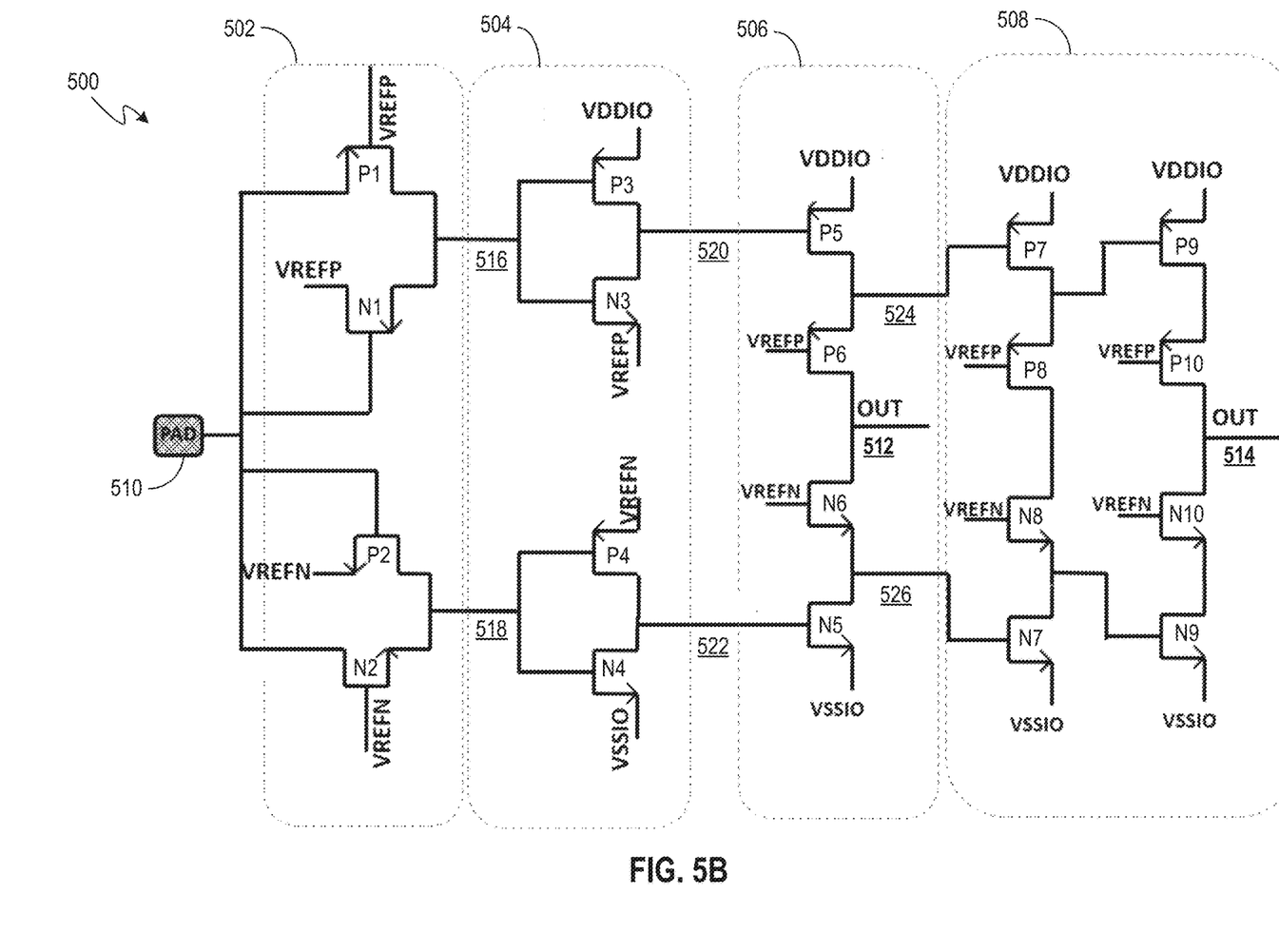
FIG. 5B illustrates a transistor-level representation of a Schmitt receiver circuit in accordance with some embodiments disclosed herein.

FIG. 5B illustrates a transistor-level representation of a Schmitt receiver circuit in accordance with some embodiments disclosed herein.

Schmitt receiver circuit 500 may include clamp circuit 502, first stage circuit 504, second stage circuit 506, and output latch 508. Clamp circuit 502 may include PMOS transistors P1 and P2, and NMOS transistors N1 and N2. First stage circuit 504 may include PMOS transistors P3 and P4, and NMOS transistors N3 and N4. Second stage circuit 506 may include PMOS transistors P5 and P6, and NMOS transistors N5 and N6. Output latch 508 may include PMOS transistors P7-P10, and NMOS transistors N7-N10.

Input pad 510 may receive an input signal and clamp circuit 502 may restrict the received input signal to a given voltage range. VREFP and VREFN are internal biasing voltages that protect the devices from stress. The voltage level of signal 518 signal is 0 to VREFN and the voltage level of signal 516 is VREFP to VDDIO. Signals 516 and 518 outputted by clamp circuit 502 may be provided as inputs to first stage 504.

First stage 504 may include two inverters: a first inverter formed by transistors P3 and N3, and a second inverter formed by transistors P4 and N4. Thus, first stage 504 provides independent control of the VIH/VIL thresholds through two different inverters. Specifically, the size ratios of transistors P3 and N3 may determine the VIH threshold and the size ratios of transistors P4 and N4 may determine the VIL threshold.

The outputs 520 and 522 from first stage 504 are merged by second stage 506 to form a latch such that a rising edge is triggered by the first inverter (P3 and N3) that senses the VIH level and a falling edge is triggered by the second inverter (P4 and N4) that senses the VIL level.

The inverters in first stage 504 may operate at a low voltage (e.g., 1.8V), which prevents device degradation. Since the two inverters operate in different voltage ranges of input pad 510, it removes the nonlinear zone present in Schmitt implementations where both the VIH and VIL level is sensed by the same cascoded inverter. In this disclosure, the term "cascode" refers to a two-stage amplifier circuit design that includes a common-source stage which feeds into a common-gate stage.

In some embodiments described herein, internal nodes of the Schmitt receiver circuit do not remain at intermediate voltage levels. Thus, static currents do not flow through the devices, which prevents aging in these devices. Specifically, second stage 506 receives a digital signal because first stage 504 converts the voltage received at input pad 510 into a digital logic 0/1 voltage signal. Consequently, signals 520 and 522 have a logic 0/1 voltage, which turns off the current path in second stage 506 when the voltage of input pad 510 is at an intermediate level (e.g., VIH/VIL), thereby removing device degradation from occurring in second stage 506. Even if a small amount of degradation occurs in the second stage transistors, it does not lead to performance degradation of Schmitt receiver circuit 500 because the VIH/VIL levels are determined by inverters in first stage 504, which operate at a low voltage (e.g., 1.8V). Thus, embodiments described herein (1) reduce the amount of device degradation, and (2) decouple the impact of device degradation from the performance of the receiver circuit.

Output 512 of second stage circuit 506 may be used as the output of Schmitt receiver circuit 500. Alternatively, signals 524 and 526 from second stage circuit 506 may be provided as inputs to output latch 508, whose output 514 may be used as the output of Schmitt receiver circuit 500.

In other words, some embodiments disclosed herein include a first stage and a second stage. The first stage can include two inverter circuits to output two output signals based on an input signal, and the first stage can independently control a high-trip voltage and a low-trip voltage that are used to determine a logic state of the input signal. The second stage can determine the logic state of the input signal by combining the two outputs of the first stage based on the high-trip voltage and the low-trip voltage. Some embodiments can include clamp circuits to restrict the voltage range of the input signal between a maximum and a minimum voltage value. In these embodiments, an output of the clamp circuits can be provided as inputs to the first stage.

Figure 6A:
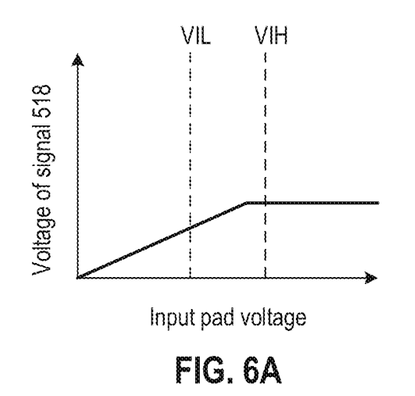
FIGS. 6A-6E illustrate transfer characteristics of different terminals in a Schmitt receiver circuit in accordance with some embodiments described herein.
Figure 6B:
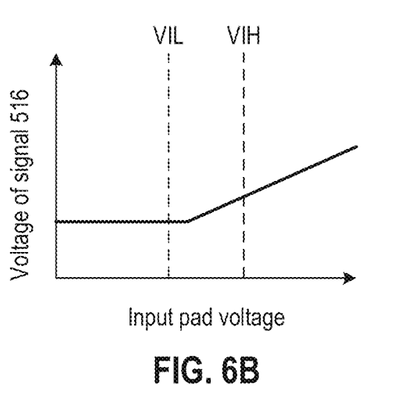
Figure 6C:
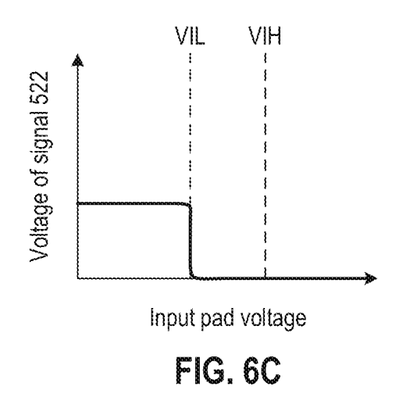
Figure 6D:
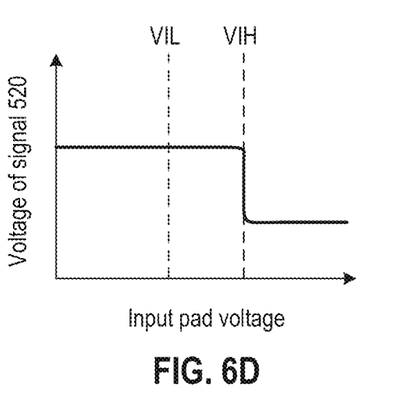
Figure 6E:
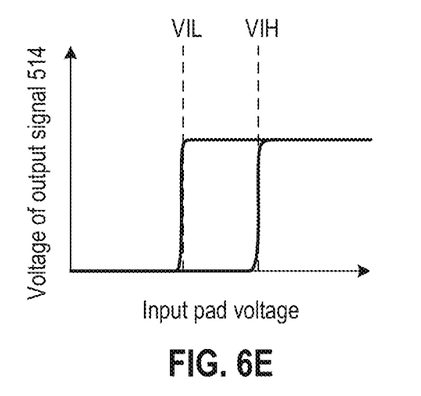

FIGS. 6A-6E illustrate transfer characteristics of different terminals in the Schmitt receiver circuit shown in FIG. 5 in accordance with some embodiments described herein. FIG. 6A plots the voltage of signal 518 with respect to the voltage of input pad 510. FIG. 6B plots the voltage of signal 516 with respect to the voltage of input pad 510. FIG. 6C plots the voltage of signal 522 with respect to the voltage of input pad 510. FIG. 6D plots the voltage of signal 520 with respect to the voltage of input pad 510. FIG. 6E plots the voltage of output 514 with respect to the voltage of input pad 510.

Figure 7:
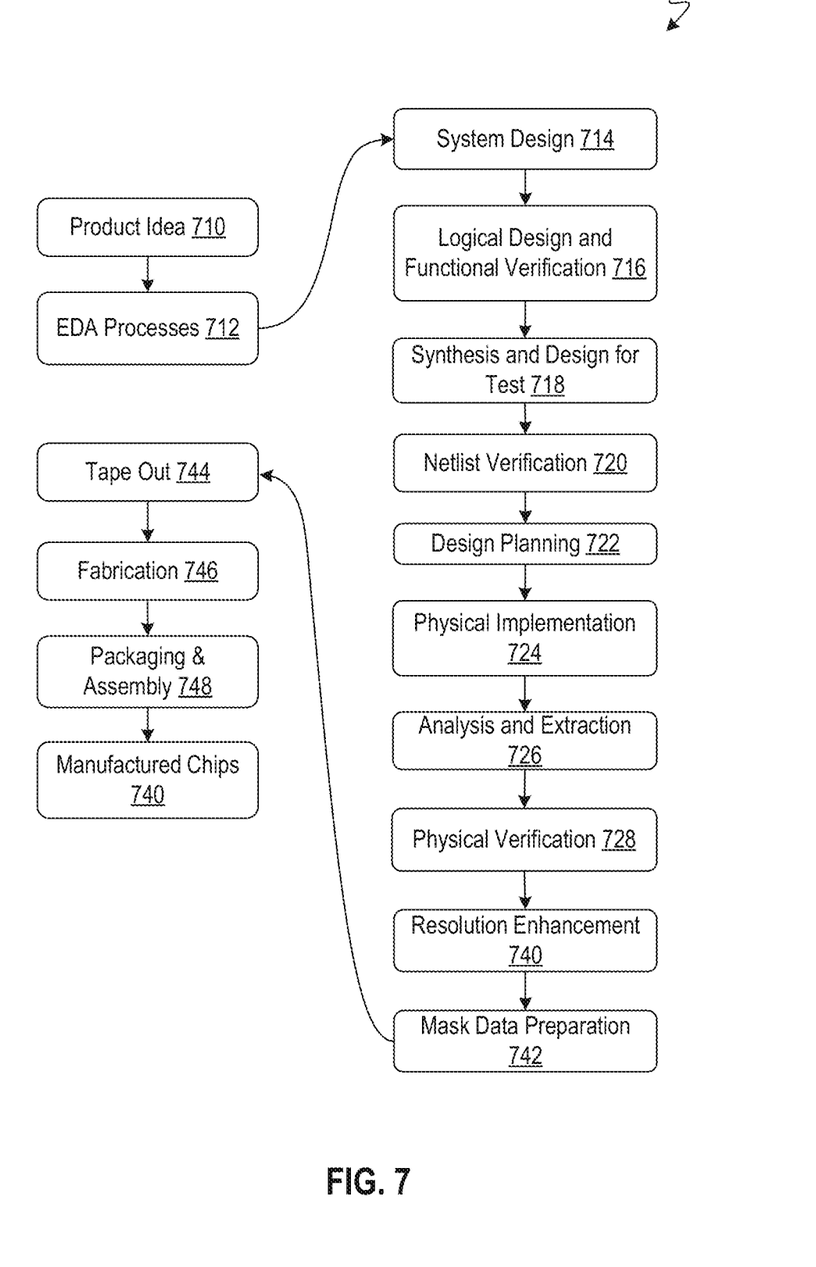
FIG. 7 illustrates an example flow for the design, verification, and fabrication of an integrated circuit in accordance with some embodiments described herein.

FIG. 7 illustrates an example flow 700 for the design, verification, and fabrication of an integrated circuit in accordance with some embodiments described herein. EDA processes 712 (the acronym "EDA" refers to "Electronic Design Automation") can be used to transform and verify design data and instructions that represent the integrated circuit. Each of these processes can be structured and enabled as multiple modules or operations.

Flow 700 can start with the creation of a product idea 710 with information supplied by a designer, information which is transformed and verified by using EDA processes 712. When the design is finalized, the design is taped-out 744, which is when artwork (e.g., geometric patterns) for the integrated circuit is sent to a fabrication facility to manufacture the mask set, which is then used to manufacture the integrated circuit. After tape-out, a semiconductor die is fabricated 746 and packaging and assembly 748 are performed to produce the manufactured IC chip 740.

Specifications for a circuit or electronic structure may range from low-level transistor material layouts to high-level description languages. A high-level of representation may be used to design circuits and systems, using a hardware description language ("HDL") such as VHDL, Verilog, SystemVerilog, SystemC, MyHDL or OpenVera. The HDL description can be transformed to a logic-level register transfer level ("RTL") description, a gate-level description, a layout-level description, or a mask-level description. Each lower representation level that is a more detailed description adds more detail into the design description. The lower levels of representation that are more detailed descriptions can be generated by a computer, derived from a design library, or created by another design automation process. An example of a specification language at a lower level of representation language for specifying more detailed descriptions is SPICE (which stands for "Simulation Program with Integrated Circuit Emphasis"). Descriptions at each level of representation contain details that are sufficient for use by the corresponding tools of that layer (e.g., a formal verification tool).

During system design 714, functionality of an integrated circuit to be manufactured is specified. The design may be optimized for desired characteristics such as power consumption, performance, area (physical and/or lines of code), and reduction of costs, etc. Partitioning of the design into different types of modules or components can occur at this stage.

During logic design and functional verification 716, modules or components in the circuit are specified in one or more description languages and the specification is checked for functional accuracy. For example, the components of the circuit may be verified to generate outputs that match the requirements of the specification of the circuit or system being designed. Functional verification may use simulators and other programs such as testbench generators, static HDL checkers, and formal verifiers. In some embodiments, special systems of components referred to as 'emulators' or 'prototyping systems' are used to speed up the functional verification.

During synthesis and design for test 718, HDL code is transformed to a netlist. In some embodiments, a netlist may be a graph structure where edges of the graph structure represent components of a circuit and where the nodes of the graph structure represent how the components are interconnected. Both the HDL code and the netlist are hierarchical articles of manufacture that can be used by an EDA product to verify that the integrated circuit, when manufactured, performs according to the specified design. The netlist can be optimized for a target semiconductor manufacturing technology. Additionally, the finished integrated circuit may be tested to verify that the integrated circuit satisfies the requirements of the specification.

During netlist verification 720, the netlist is checked for compliance with timing constraints and for correspondence with the HDL code. During design planning 722, an overall floor plan for the integrated circuit is constructed and analyzed for timing and top-level routing.

During layout or physical implementation 724, physical placement (positioning of circuit components such as transistors or capacitors) and routing (connection of the circuit components by multiple conductors) occurs, and the selection of cells from a library to enable specific logic functions can be performed. As used herein, the term 'cell' may specify a set of transistors, other components, and interconnections that provides a Boolean logic function (e.g., AND, OR, NOT, XOR) or a storage function (such as a flipflop or latch). As used herein, a circuit 'block' may refer to two or more cells. Both a cell and a circuit block can be referred to as a module or component and are enabled as both physical structures and in simulations. Parameters are specified for selected cells (based on 'standard cells') such as size and made accessible in a database for use by EDA products.

During analysis and extraction 726, the circuit function is verified at the layout level, which permits refinement of the layout design. During physical verification 728, the layout design is checked to ensure that manufacturing constraints are correct, such as DRC constraints, electrical constraints, lithographic constraints, and that circuitry function matches the HDL design specification. During resolution enhancement 740, the geometry of the layout is transformed to improve how the circuit design is manufactured.

During tape-out, data is created to be used (after lithographic enhancements are applied if appropriate) for production of lithography masks. During mask data preparation 742, the 'tape-out' data is used to produce lithography masks that are used to produce finished integrated circuits.

A storage subsystem of a computer system (such as computer system 800 of FIG. 8) may be used to store the programs and data structures that are used by some or all of the EDA products described herein, and products used for development of cells for the library and for physical and logical design that use the library.

Figure 8:
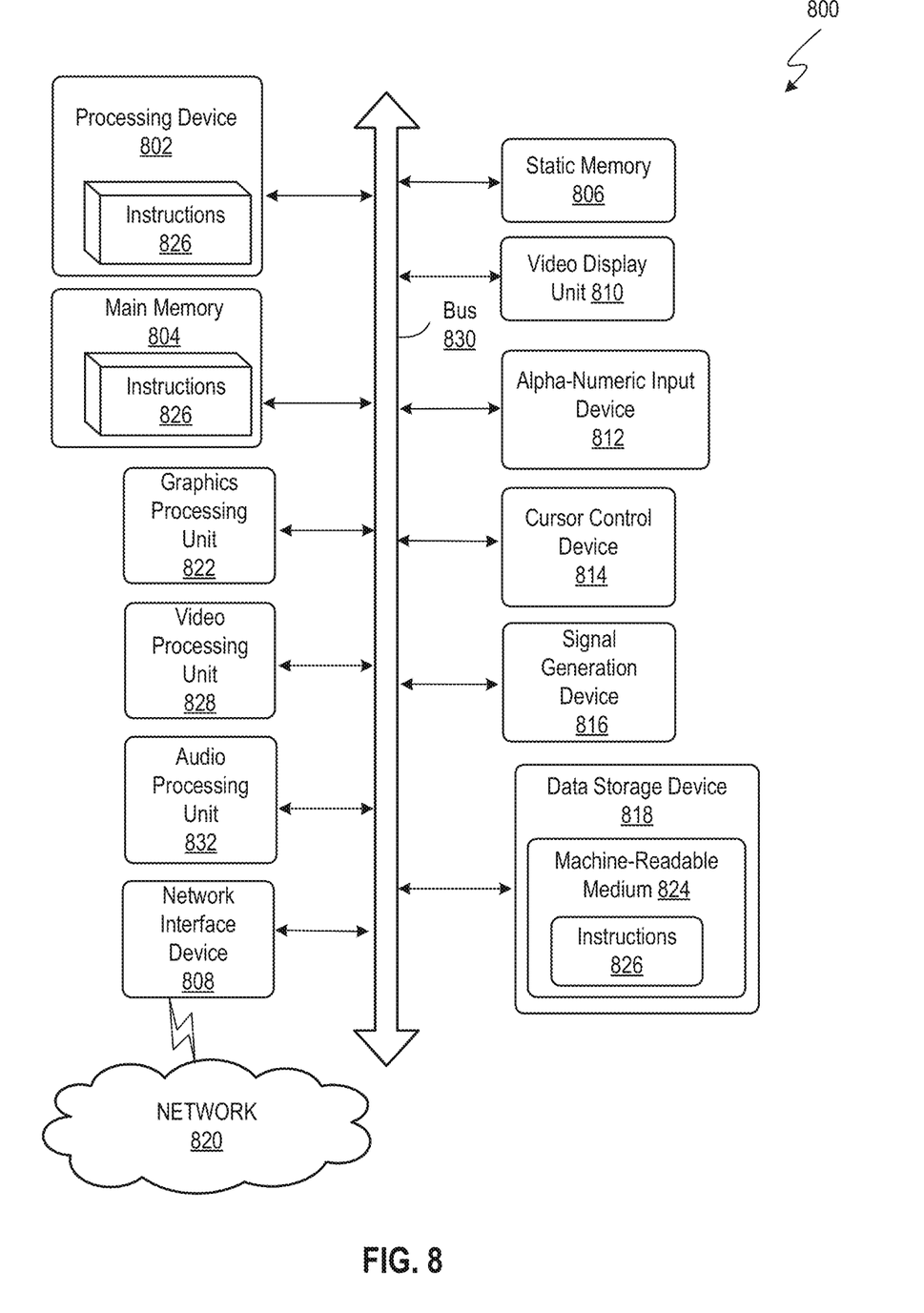
FIG. 8 illustrates an example machine of a computer system within which a set of instructions, for causing the machine to perform any one or more of the methodologies discussed herein, may be executed.

FIG. 8 illustrates an example machine of a computer system 800 within which a set of instructions, for causing the machine to perform any one or more of the methodologies discussed herein, may be executed. In alternative implementations, the machine may be connected (e.g., networked) to other machines in a LAN, an intranet, an extranet, and/or the Internet. The machine may operate in the capacity of a server or a client machine in client-server network environment, as a peer machine in a peer-to-peer (or distributed) network environment, or as a server or a client machine in a cloud computing infrastructure or environment.

The machine may be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 800 includes a processing device 802, a main memory 804 (e.g., read-only memory (ROM), flash memory, dynamic random access memory (DRAM) such as synchronous DRAM (SDRAM), a static memory 806 (e.g., flash memory, static random access memory (SRAM), etc.), and a data storage device 818, which communicate with each other via a bus 830.

Processing device 802 represents one or more processors such as a microprocessor, a central processing unit, or the like. More particularly, the processing device may be complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 802 may also be one or more special-purpose processing devices such as an application specific integrated circuit (ASIC), a field programmable gate array (FPGA), a digital signal processor (DSP), network processor, or the like. The processing device 802 may be configured to execute instructions 826 for performing the operations and steps described herein.

The computer system 800 may further include a network interface device 808 to communicate over the network 820. The computer system 800 also may include a video display unit 810 (e.g., a liquid crystal display (LCD) or a cathode ray tube (CRT)), an alphanumeric input device 812 (e.g., a keyboard), a cursor control device 814 (e.g., a mouse), a graphics processing unit 822, a signal generation device 816 (e.g., a speaker), graphics processing unit 822, video processing unit 828, and audio processing unit 832.

The data storage device 818 may include a machine-readable storage medium 824 (also known as a non-transitory computer-readable medium) on which is stored one or more sets of instructions 826 or software embodying any one or more of the methodologies or functions described herein. The instructions 826 may also reside, completely or at least partially, within the main memory 804 and/or within the processing device 802 during execution thereof by the computer system 800, the main memory 804 and the processing device 802 also constituting machine-readable storage media.

In some implementations, the instructions 826 include instructions to implement functionality corresponding to the present disclosure. While the machine-readable storage medium 824 is shown in an example implementation to be a single medium, the term "machine-readable storage medium" should be taken to include a single medium or multiple media (e.g., a centralized or distributed database, and/or associated caches and servers) that store the one or more sets of instructions. The term "machine-readable storage medium" shall also be taken to include any medium that is capable of storing or encoding a set of instructions for execution by the machine and that cause the machine and the processing device 802 to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm may be a sequence of operations leading to a desired result. The operations are those requiring physical manipulations of physical quantities. Such quantities may take the form of electrical or magnetic signals capable of being stored, combined, compared, and otherwise manipulated. Such signals may be referred to as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the present disclosure, it is appreciated that throughout the description, certain terms refer to the action and processes of a computer system, or similar electronic computing device, that manipulates and transforms data represented as physical (electronic) quantities within the computer system's registers and memories into other data similarly represented as physical quantities within the computer system memories or registers or other such information storage devices.

The present disclosure also relates to an apparatus for performing the operations herein. This apparatus may be specially constructed for the intended purposes, or it may include a computer selectively activated or reconfigured by a computer program stored in the computer. Such a computer program may be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various other systems may be used with programs in accordance with the teachings herein, or it may prove convenient to construct a more specialized apparatus to perform the method. In addition, the present disclosure is not described with reference to any particular programming language. It will be appreciated that a variety of programming languages may be used to implement the teachings of the disclosure as described herein.

The present disclosure may be provided as a computer program product, or software, that may include a machine-readable medium having stored thereon instructions, which may be used to program a computer system (or other electronic devices) to perform a process according to the present disclosure. A machine-readable medium includes any mechanism for storing information in a form readable by a machine (e.g., a computer). For example, a machine-readable (e.g., computer-readable) medium includes a machine (e.g., a computer) readable storage medium such as a read only memory ("ROM"), random access memory ("RAM"), magnetic disk storage media, optical storage media, flash memory devices, etc.

In the foregoing disclosure, implementations of the disclosure have been described with reference to specific example implementations thereof. It will be evident that various modifications may be made thereto without departing from the scope of implementations of the disclosure as set forth in the following claims. Where the disclosure refers to some elements in the singular tense, more than one element can be depicted in the figures and like elements are labeled with like numerals. The disclosure and drawings are, accordingly, to be regarded in an illustrative sense rather than a restrictive sense.

What is claimed is:

1. A circuit, comprising:
   a first clamp circuit to generate a first clamp output signal based on the input signal, wherein the first clamp output signal is substantially equal to the input signal when the input signal is within a first voltage range and substantially equal to a first constant voltage when the input signal is beyond the first voltage range;
   a second clamp circuit to generate a second clamp output signal based on the input signal, wherein the second clamp output signal is substantially equal to the input signal when the input signal is within a second voltage range and substantially equal to a second constant voltage when the input signal is beyond the second voltage range;
   a first stage comprising a first inverter circuit to generate a first signal based on the first clamp output signal and a second inverter circuit to generate a second signal based on second clamp output signal, wherein the first inverter circuit and the second inverter circuit are powered by a first power-supply-voltage range; and
   a second stage to determine a logic state of the input signal by combining the first signal generated by the first inverter circuit and the second signal generated by the second inverter circuit, wherein the second stage is powered by a second power-supply-voltage range that is greater than the first power-supply-voltage range, wherein the second stage comprises a set of p-type metal-oxide-semiconductor (PMOS) transistors and a set of n-type metal-oxide-semiconductor (NMOS) transistors coupled in series, and wherein the first signal is provided to a gate of a PMOS transistor in the set of PMOS transistors and the second signal is provided to a gate of an NMOS transistor in the set of NMOS transistors.

2. The circuit of claim 1, comprising a latch circuit to store the logic state of the input signal determined by the second stage.

3. The circuit of claim 1, wherein the first stage separately implements a high-trip voltage and a low-trip voltage that are used to determine the logic state of the input signal.

4. A method, comprising:
   outputting, by a first clamp circuit, a first clamp output signal which is substantially equal to an input signal when the input signal is within a first voltage range and substantially equal to a first constant voltage when the input signal is outside the first voltage range;
   outputting, by a second clamp circuit, a second clamp output signal which substantially equal to the input signal when the input signal is within a second voltage range and substantially equal to a second constant voltage when the input signal is outside the second voltage range;
   generating, by a first inverter circuit, a first signal based on the first clamp output signal, wherein the first inverter circuit is powered by a first power-supply-voltage range;
   generating, by a second inverter circuit, a second signal based on the second clamp output signal, wherein the second inverter circuit is powered by the first power-supply-voltage range; and
   determining, by a third circuit, a logic state of the input signal by combining the first signal generated by the first inverter circuit and the second signal generated by the second inverter circuit, wherein the third circuit is powered by a second power-supply-voltage range that is greater than the first power-supply-voltage range, wherein the third circuit comprises a set of p-type metal-oxide-semiconductor (PMOS) transistors and a set of n-type metal-oxide-semiconductor (NMOS) transistors coupled in series, and wherein the first signal is provided to a gate of a PMOS transistor in the set of PMOS transistors and the second signal is provided to a gate of an NMOS transistor in the set of NMOS transistors.

5. The method of claim 4, comprising storing, by a latch circuit, the logic state of the input signal determined by the third circuit.

6. The method of claim 4, wherein a high-trip voltage and a low-trip voltage that are used to determine the logic state of the input signal are determined by the first inverter circuit and the second inverter circuit, respectively.

7. A receiver circuit, comprising:
an input pad to receive a digital signal;
a first clamp circuit and a second clamp circuit to generate a first clamp output signal and a second clamp output signal, respectively, wherein the first clamp circuit and the second clamp circuit restrict a voltage range of the digital signal;
a first stage comprising a first inverter circuit to generate a first signal based on first clamp output signal and a second inverter circuit to generate a second signal based on the second clamp output signal;
a second stage to determine a logic state of the digital signal by combining the first signal generated by the first inverter circuit and the second signal generated by the second inverter circuit, wherein the second stage comprises a set of p-type metal-oxide-semiconductor (PMOS) transistors and a set of n-type metal-oxide-semiconductor (NMOS) transistors coupled in series, and wherein the first signal is provided to a gate of a PMOS transistor in the set of PMOS transistors and the second signal is provided to a gate of an NMOS transistor in the set of NMOS transistors; and
a latch circuit to store the logic state of the digital signal determined by the second stage.

8. The receiver circuit of claim 7, wherein the first stage independently controls a high-trip voltage and a low-trip voltage that are used to determine the logic state of the input signal.

\* \* \* \* \*